(12) United States Patent
Rahman et al.

(10) Patent No.: US 7,368,946 B1
(45) Date of Patent: May 6, 2008

(54) LEVEL-SHIFTING PASS GATE MULTIPLEXER

(75) Inventors: Arifur Rahman, San Jose, CA (US);
Sean W. Kao, South Pasadena, CA (US)

(73) Assignee: XILINX, Inc., San Jose, CA (US)

( * ) Notice: Subject to any disclaimer, the term of this patent is extended or adjusted under 35 U.S.C. 154(b) by 48 days.

(21) Appl. No.: 11/454,315

(22) Filed: Jun. 16, 2006

(51) Int. Cl.
*H03K 19/173* (2006.01)
*G06F 7/38* (2006.01)

(52) U.S. Cl. .......................................... 326/46; 326/38

(58) Field of Classification Search ................ 326/46, 326/38, 40, 49, 63, 113
See application file for complete search history.

(56) References Cited

U.S. PATENT DOCUMENTS

| 6,992,505 B1 | 1/2006 | Zhou | |
|---|---|---|---|
| 2003/0179027 A1* | 9/2003 | Kizer et al. | 327/158 |
| 2003/0179028 A1* | 9/2003 | Kizer et al. | 327/158 |
| 2005/0039155 A1 | 2/2005 | New | |
| 2005/0040851 A1 | 2/2005 | New | |
| 2005/0189971 A1* | 9/2005 | Kizer et al. | 327/147 |
| 2005/0206419 A1* | 9/2005 | Kizer et al. | 327/158 |

OTHER PUBLICATIONS

U.S. Appl. No. 11/390,925, filed Mar. 28, 2006, Rahut et al.
U.S. Appl. No. 11/454,316, Tuan et al., filed Jun. 16, 2006, Structures and Methods for Heterogeneous Low Power Programmable Logic Device, Xilinx, Inc. 2100 Logic Drive, San Jose, CA 95124.

* cited by examiner

*Primary Examiner*—Daniel Chang
(74) *Attorney, Agent, or Firm*—William L. Paradice, III

(57) ABSTRACT

The present invention incorporates level-shifting functions within a multiplexer circuit that may be implemented in IC devices having low and high voltage domains. The multiplexer circuit utilizes pseudo-differential multiplexing architectures and employs level-shifting techniques to convert low-voltage signals received from the low-voltage domain into high-voltage signals more suitable for controlling the propagation of a selected input signal through the pass gates of the multiplexer circuit. For some embodiments, some of the select signals may be decoded to generate a number of decoded select signals that can be used to control the selective routing of signals through the multiplexer.

19 Claims, 8 Drawing Sheets

LEVEL-SHIFTING PASS GATE MULTIPLEXER

FIELD OF INVENTION

This invention relates generally to multiplexer circuits, and more particularly to multiplexer circuits capable of level-shifting logic signals.

DESCRIPTION OF RELATED ART

Multiplexer circuits are very common in integrated circuits (ICs) and other electronic circuits. For example, multiplexer circuits are used throughout many programmable logic devices (PLDs), such as field programmable gate arrays (FPGAs) and complex programmable logic devices (CPLDs), to programmably select one of several different input signals to pass to a logic destination, or to select one of several stored values to provide as the output signal from a lookup table (LUT). Therefore, multiplexers can form a significant portion of the logic circuitry in a PLD.

FIG. 1 illustrates a well-known 8-to-1 binary multiplexer (MUX) circuit 100. A similar MUX architecture is commonly used to implement look-up tables (LUT) that form function generators in the configurable logic blocks of an FPGA. The choice of eight input signals for the various MUX circuits illustrated herein is purely exemplary. MUX circuits often have fewer or more than eight input signals. The drawings herein are standardized on 8-to-1 MUX circuits simply to simplify the drawings and to provide a common standard for comparison purposes. MUX circuits having different numbers of input signals are easily extrapolated from the illustrated examples by those of skill in the relevant arts.

MUX architecture 100 is shown to include a MUX circuit 110 and a keeper circuit 120. MUX circuit 110, which includes inputs to receive input signals IN0-IN7 and select terminals to receive select signals SA-SC, is implemented using three hierarchical levels of 2:1 MUXes formed by pairs of NMOS transistors, as depicted in FIG. 1. More specifically, the first-level MUXes formed by transistor pairs MA0-MA1, MA2-MA3, MA4-MA5, and MA6-MA7 receive input signal pairs IN0-IN1, IN2-IN3, IN4-IN5, and IN6-IN7, respectively, where transistors MA0, MA2, MA4, and MA6 have gates responsive to SA, and transistors MA1, MA3, MA5, and MA7 have gates responsive to $\overline{SA}$, which is the logical complement of SA provided by inverter INVA. The second-level MUXes formed by transistor pairs MB0-MB1 and MB2-MB3 receive input signals from corresponding pairs of the first-level MUXes, where transistors MB0 and MB2 have gates responsive to SB, and transistors MB1 and MB3 have gates responsive to $\overline{SB}$, which is the logical complement of SB provided by inverter INVB. The third-level MUX formed by transistor pair MC0-MC1 receives input signals from corresponding pairs of the second-level MUXes and includes an output terminal at node N1, where transistor MC0 has a gate responsive to SC, and transistor MC1 has gate responsive to $\overline{SC}$, which is the logical complement of SC provided by inverter INVC.

Keeper circuit 120 includes CMOS inverter INV1 and a PMOS pull-up transistor MP1. Inverter INV1 is coupled between node N1 and the MUX architecture's output terminal OUT, and has power terminals coupled to ground potential and to VDD. Although not shown for simplicity, inverter INV1 is formed in a well-known manner by a PMOS and an NMOS transistor pair coupled in series between VDD and ground potential. PMOS transistor MP1 is coupled between VDD and node N1, and has a gate coupled to OUT.

When MUX architecture 100 is used to implement a LUT in an FPGA, the input signals IN0-IN7 are typically stored in SRAM configuration cells (not shown for simplicity) and the select signals SA-SC are used as LUT input signals to select one of signals IN0-IN7 to output as OUT in a well-known manner. For example, to select IN0 for output as OUT, SA-SC are all driven to a logic high state of VDD, thereby turning on transistors MA0, MB0, and MC0 so that IN0 propagates through transistors MA0, MB0, and MC0 to node N1 as IN_N1. The logic high value of IN_N1 is logically inverted by INV1 to drive OUT to logic low. For applications in which the logic "1" values of IN0-IN7 and the logic "1" values of SA-SC are approximately equal to VDD, the input signal IN0 experiences a voltage drop as it propagates through NMOS pass gates MA0, MB0, and MC0 such that the logic "1" value of IN_N1 is approximately equal to VDD–Vth, where Vth is the total voltage drop across transistors MA0, MB0, and MC0. Keeper circuit 120 compensates for this voltage drop by turning on PMOS transistor MP1 when OUT is driven to logic low, thereby pulling the voltage of IN_N1 to approximately VDD.

The MUX architecture of FIG. 1 works well with sufficiently high values of VDD. For example, as long as the voltage level VDD–Vth is high enough to flip inverter INV1 and turn on PMOS pull-up transistor MP1, the circuit functions properly. However, power voltage levels (VDD) are much lower in today's ICs than was previously the case. For example, when VDD=1.2 volts and Vth=0.5 volts, a voltage level of VDD–Vth=0.7 volts cannot be relied upon to flip inverter INV1.

Various methods have been used to resolve this problem. One known method is to use a gate voltage higher than VDD when driving a logic "1" high value onto the gates of the NMOS pass transistors, for example, by implementing select signals SA-SC and inverters INVA-INVC using a "pumped" high voltage greater than VDD. For example, if the NMOS gate voltage is higher than VDD by one threshold voltage Vth, the resulting voltage of IN_N1 at node N1 is VDD+Vth–Vth, or simply VDD. However, this solution complicates the fabrication of the circuit, especially at very short gate lengths.

Perhaps more importantly, many newer FPGA architectures utilize multiple voltage domains to balance the desire for high performance with the desire for low power consumption. For example, in some FPGAs, resources such as configurable logic blocks (CLB) are powered by a relatively high supply voltage (VDDH), and resources such as the programmable interconnect are powered by a relatively low supply voltage (VDDL). Thus, when MUX architecture 100 is used to implement a LUT in a CLB, the input signals IN0-IN7 are typically stored in configuration memory cells (not shown for simplicity) powered by VDDH, and the select signals SA-SC are received from a low-voltage domain powered by a relatively low supply voltage VDDL, where for purposes of discussion herein VDDH is equal to approximately 1.2 volts and VDDL is equal to approximately 0.8 volts. For such FPGAs, because the logic "1" values of IN0-IN7 are approximately equal to VDDH and the logic "1" values of select signals SA-SC are approximately equal to VDDL, level-shifter circuits are typically required to increase the peak voltage level of select signals SA-SC from VDDL to VDDH so that MUX architecture 100 operates properly. Unfortunately, using level-shifters for select signals SA-SC not only increases circuit area but also introduces circuit delays for select signals SA-SC.

Thus, there is a need to incorporate level-shifting functions within the MUX architectures that implement LUTs in the CLBs of FPGA devices.

SUMMARY

The present invention incorporates level-shifting functions within a multiplexer circuit that may be implemented in IC devices such as an FPGA having two-different voltage domains, e.g., a low-voltage domain and a high-voltage domain. The multiplexer circuit utilizes pseudo-differential multiplexing architectures and employs level-shifting techniques to convert low-voltage signals received from the low-voltage domain into high-voltage signals more suitable for the high-voltage domain. In this manner, multiplexer circuits of the present invention may reduce propagation delay and/or may minimize voltage drops of signals selected to be propagated through the multiplexer circuit.

For some embodiments, the multiplexer circuit includes a level-shifting decoder circuit, two multiplexers, a signal inversion circuit, and an output circuit. The level-shifting decoder circuit has inputs to receive two or more of the low-voltage select signals and is configured to generate a number of high-voltage decoded select signals. The first multiplexer has inputs to receive the high-voltage input signals, has select terminals responsive to a combination of the low-voltage select signals and the high-voltage decoded select signals, and has an output. The signal inversion circuit generates logical complements of the high-voltage input signals. The second multiplexer has, inputs to receive the high-voltage complemented input signals, has select terminals responsive to the combination of the low-voltage select signals and the high-voltage decoded select signals, and has an output. The output circuit has inputs coupled to the outputs of the first and second multiplexers, and has first and second output terminals to generate a differential output signal for the multiplexer circuit.

For some embodiments, the first and second multiplexers are organized as hierarchical levels of pass transistors, for example, where the pass transistors in the first level are organized in pairs and are coupled to receive the input signals, and the transistors in the second level are coupled between corresponding transistor pairs in the first level and output terminals in the second level. For one embodiment, the gates of the transistors in the first level are responsive to the low-voltage select signals, and the gates of the transistors in the second level are responsive to the high-voltage decoded select signals. By driving the pass gates in the second hierarchical level with high-voltage select signals, as opposed to low-voltage select signals, propagation delays across the pass gates are reduced. In addition, by utilizing decoded select signals to control the second hierarchical level, the third hierarchical level of previous MUX architectures may be eliminated, thereby reducing circuit area and reducing the number of gate delays.

For other embodiments, the first and second multiplexers are organized as hierarchical levels of pass transistors, for example, where the pass transistors in the first hierarchical level receive the input signals and are responsive to the low-voltage encoded select signals, and the transistors in the second hierarchical level are arranged in pairs and are responsive to the high-voltage decoded select signals. By driving the pass gates in the first hierarchical level with high-voltage select signals, as opposed to low-voltage select signals, propagation delays across the pass gates are reduced. In addition, by utilizing decoded select signals to control the first hierarchical level, the third hierarchical level of previous MUX architectures may be eliminated, thereby reducing circuit area and reducing the number of gate delays.

In addition, the output circuit restores the voltage levels of signals propagated through the multiplexer circuit to their maximum values, thereby ensuring that the output inverters trigger properly and also maintaining an acceptable drive strength for the output signals.

Further, the invention enables the use of multiplexers that include only N-channel transistors in the signal paths between the data input and output terminals, even at very low operating voltages. Power dissipation and leakage current are also lower than is normally achieved using traditional multiplexer circuits. Additionally, the layout area required to implement the resulting structures is less than is required for traditional CMOS implementations.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

In the following description, for purposes of explanation, specific nomenclature is set forth to provide a thorough understanding of the present invention. In other instances, well-known circuits and devices are shown in block diagram form to avoid obscuring the present invention unnecessarily. Further, the logic states of various signals described herein are exemplary and therefore may be reversed or otherwise modified as generally known in the art. Accordingly, the present invention is not to be construed as limited to specific examples described herein but rather includes within its scope all embodiments defined by the appended claims.

Figure 2:
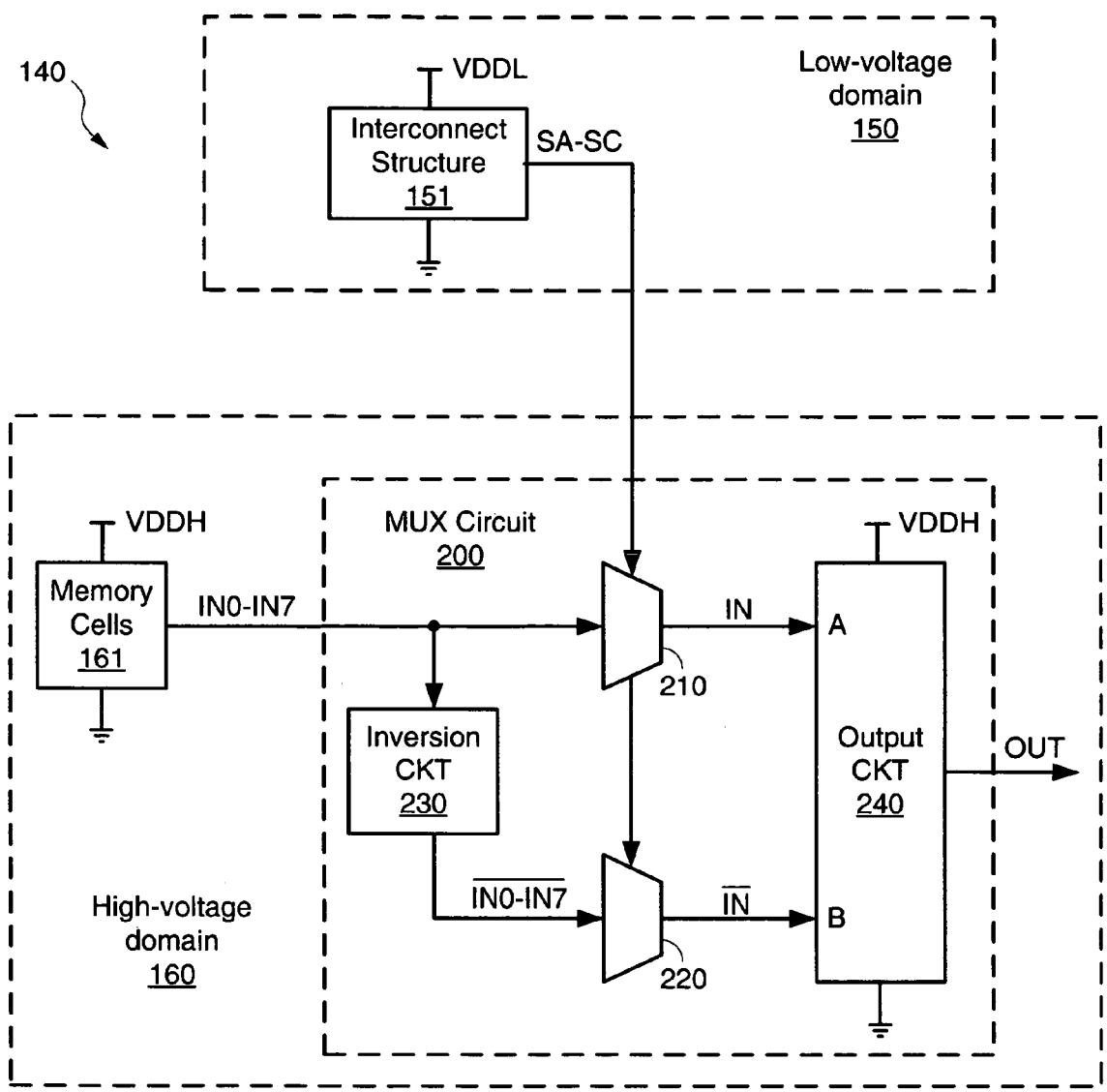
FIG. 2 is a simplified functional block diagram of an IC device including a level-shifting multiplexer circuit in accordance with first embodiments of the present invention.

FIG. 2 shows an IC device 140 including a pseudo-differential multiplexer circuit 200 in accordance with first embodiments of the present invention. IC device 140, which may be any suitable IC device, includes a low-voltage domain 150 and a high-voltage domain 160. Low-voltage domain 150 is powered by a relatively low supply voltage VDDL, and includes a well-known interconnect structure 151 having a power terminal coupled to VDDL and having outputs to generate low-voltage select signals SA-SC. High-voltage domain 160 includes multiplexer (MUX) circuit 200 and a plurality of memory cells 161 having power terminals coupled to VDDH. Memory cells 161, which may be any suitable type of memory cell such as DRAM or SRAM cells, provide high-voltage input signals IN0-IN7 to MUX circuit 200, which in response to select signals SA-SC outputs one of IN0-IN7 as a high-voltage output signal OUT. For some embodiments, memory cells 161 and MUX circuit 200 may form a look-up table (LUT) that generates OUT as a predetermined logic function of select signals SA-SC.

For other embodiments, the configuration memory cells that store IN0-IN7 may be powered by a regulated voltage (Vgg), where Vgg=VDDH+Vth. For such embodiments, input signals IN0-IN7 have a logic "1" voltage of approximately Vgg.

For some embodiments, IC device 140 is an FPGA device having different voltage domains 150 and 160, where interconnect structure 151 forms part of the switch fabric of the FPGA device and the LUT formed by memory cells 161 and MUX circuit 200 implements a function generator in a configurable logic block (CLB) of the FPGA device. Of course, for other embodiments, IC device 140 may be another programmable logic device such as a complex PLD, or may be a dedicated logic device such as an ASIC device.

For purposes of discussion herein, the low-voltage select signals SA-SC have voltage swings approximately between 0 volts and VDDL, and input signals IN0-IN7 have voltage swings approximately between 0 volts and VDDH. VDDL and VDDH may be any suitable supply voltages. For one embodiment, VDDL is approximately 0.8 volts and VDDH is approximately 1.2 volts, although other voltage levels may be used for VDDL and VDDH.

MUX circuit 200 includes two MUXes 210 and 220, an inversion circuit 230 coupled between the input terminals of the two MUXes 210 and 220, and an output circuit 240 coupled to the output terminals of the two MUXes 210 and 220. More specifically, the first MUX 210 includes a plurality of inputs to receive input signals IN0-IN7 from memory cells 161, select terminals to receive select signals SA-SC from interconnect structure 151, and an output coupled to a first input of output circuit 240 at node A. Inversion circuit 230 includes inputs to receive IN0-IN7, and is configured to generate complementary input signals $\overline{\text{IN0-IN7}}$ at its output terminals. The second MUX 220 includes a plurality of inputs to receive complementary input signals $\overline{\text{IN0-IN7}}$ from inversion circuit 230, select terminals to receive select signals SA-SC, and an output coupled to a second input of output circuit 240 at node B.

MUxes 210 and 220 may be any suitable multiplexers such as, for example, binary multiplexers or one-hot multiplexers. For some embodiments, MUXes 210 and 220 include only NMOS transistors on each signal path between the input terminals and the output terminal of each multiplexer. Further, the select terminals of the two MUXes 210 and 220 are coupled such that the two MUXes 210 and 220 are configured to select a corresponding one of their respective input signals IN0-IN7 and $\overline{\text{IN0-IN7}}$, respectively, in response to equivalent signals received at their respective select input terminals.

Inversion circuit 230 may be implemented using any suitable circuitry. For one embodiment, inversion circuit 230 may include a plurality of inverters (e.g., CMOS inverters) each coupled between a corresponding pair of inputs of MUXes 210 and 220. For another embodiment, inversion circuit 230 may be part of a memory cell providing true and complement logic signals to MUXes 210 and 220, respectively. For yet another embodiment, inversion circuit 230 may be implemented using pull-down transistors gated by corresponding input signals, as known in the art. Further, although not shown for simplicity, for some embodiments, inversion circuit 230 includes power terminal coupled to VDDH and ground potential.

Output circuit 240, which includes power terminals coupled to VDDH and ground potential, is configured to generate the output signal OUT in response to the voltage differential between its two input terminals at nodes A and B, thereby allowing a relatively low voltage value of a logic "1" input signal IN0-IN7 to drive OUT to its proper logic state, as described in more detail below. For some embodiments, output circuit 240 may be configured to level-shift the signals IN and $\overline{\text{IN}}$ received from MUXes 210 and 220, respectively, when generating OUT.

Figure 3:
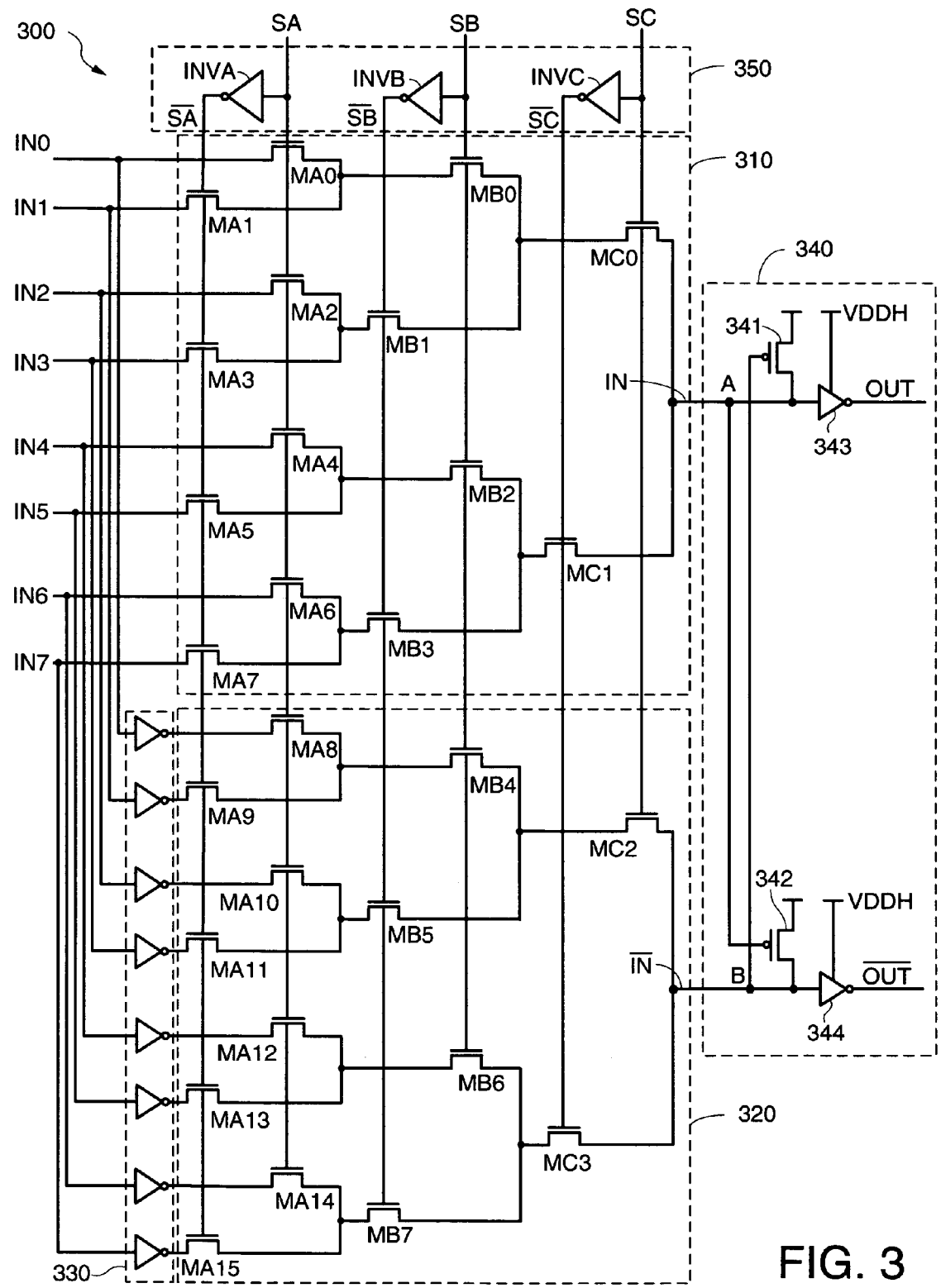
FIG. 3 is a circuit diagram of one embodiment of the level-shifting multiplexer circuit of FIG. 2.

FIG. 3 shows a MUX circuit 300 that is one embodiment of MUX circuit 200 of FIG. 2. Circuit 300 is shown to include a first MUX 310, a second MUX 320, an input signal inversion circuit 330, and an output circuit 340. Further, FIG. 3 shows a select signal inversion circuit 350 having inverters INVA-INVC that logically complement select signals SA-SC to generate complementary select signals $\overline{\text{SA}}$-$\overline{\text{SC}}$, respectively. Although not shown for simplicity, inverters INVA-INVC include power terminals coupled to VDDL and ground potential, and therefore signals $\overline{\text{SA}}$-$\overline{\text{SC}}$ have logic "1" values equal to VDDL. Thus, although depicted in the exemplary embodiment of FIG. 3 as part of MUX circuit 300, for actual embodiments, inversion circuit 350 may be formed within the low-voltage domain 150 of IC device 140.

Figure 1:
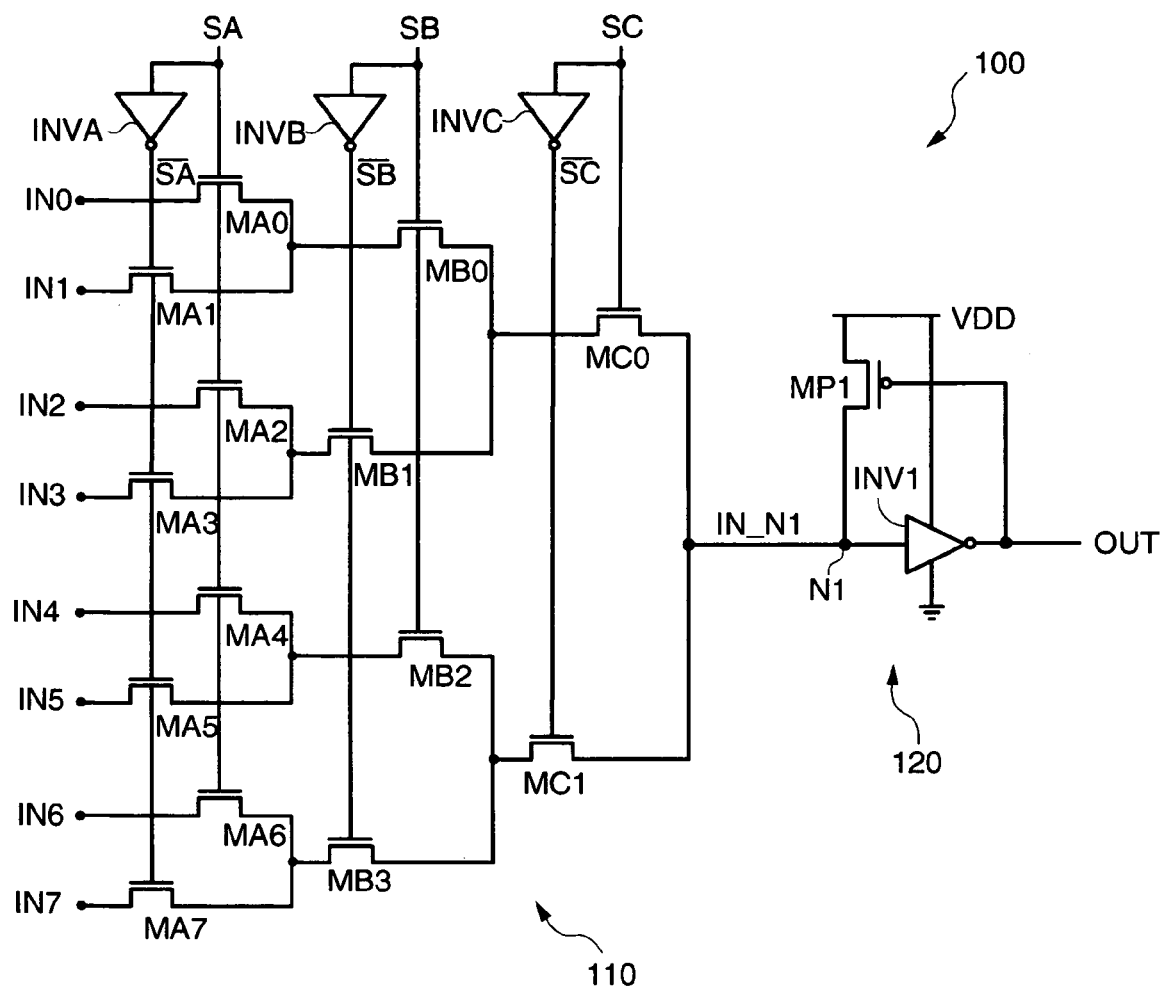
FIG. 1 is a circuit diagram of a well-known multiplexer circuit that may be used to implement look-up tables in an FPGA device.

MUX 310, which is one embodiment of MUX 210 of FIG. 2, is implemented as a standard binary multiplexer that selectively provides one of input signals IN0-IN7 as IN to node A in response to select signals SA-SC. Inversion circuit 330, which is one embodiment of inversion circuit 230 of FIG. 2, is shown to include eight inverters that logically complement IN0-IN7 to generate $\overline{\text{IN0-IN7}}$, respectively, although other well-known circuitry may be used to implement inversion circuit 330. MUX 320, which is one embodiment of MUX 220 of FIG. 2, is implemented as a standard binary multiplexer that selectively provides one of complemented input signals $\overline{\text{IN0-IN7}}$ as $\overline{\text{IN}}$ to node B in response to select signals SA-SC. Because the architecture and operation of MUXes 310 and 320 are similar to the well-known MUX circuit 110 of FIG. 1, a detailed description thereof is not repeated herein for brevity.

Output circuit 340, which is one embodiment of output circuit 240 of FIG. 2, includes cross-coupled PMOS pull-up transistors 341-342 and inverters 343-344. More specifically, pull-up transistor 341 is coupled between VDDH and node A, and has a gate coupled to node B. Pull-up transistor 342 is coupled between VDDH and node B, and has a gate coupled to node A. Inverter 343, which has power terminals coupled to VDDH and ground potential and may be a CMOS inverter, includes an input coupled to node A and includes an output to generate an output signal OUT. Inverter 344, which has power terminals coupled to VDDH and ground potential and may be a CMOS inverter, includes an input coupled to node B and includes an output to generate a complementary output signal $\overline{\text{OUT}}$. For other embodiments, pull-up transistors 341 and 343 may be eliminated from output circuit 340.

In operation, select signals SA-SC select one of input signals IN0-IN7 to be propagated through MUX 310 as IN to node A, and also select a corresponding one of complemented input signals $\overline{IN0}$-$\overline{IN7}$ to be propagated through MUX 320 as $\overline{IN}$ to node B. For example, if SA-SC are all driven to logic high (e.g., to VDDL), and IN0 has a logic "1" value of VDDH, the logic high states of SA-SC turn on NMOS pass transistors MA0, MB0, and MC0, respectively, thereby propagating the logic "1" value of IN0 through pass transistors MA0, MB0, and MC0 as IN to node A. Because the gates of pass transistors are driven by logic "1" voltages of VDDL, the resultant logic high state of IN at node A is approximately VDDL−Vth. The logic high voltages of SA-SC also turn on NMOS pass transistors MA8, MB4, and MC2, thereby propagating the logic "0" value of $\overline{IN0}$ through pass transistors MA8, MB4, and MC2 as $\overline{IN}$ to node B. The logic low state of $\overline{IN}$ at node B triggers inverter 344, which drives $\overline{OUT}$ high to VDDH. The logic low state of $\overline{IN}$ at node B also turns on pull-up transistor 341, which pulls the voltage of IN at node A from VDDL−Vth to VDDH. In response thereto, inverter 343 drives OUT low to ground potential. The logic high state of IN at node A also turns off pull-up transistor 342, thereby isolating node B from VDDH.

The differential operation of circuit 300 is advantageous for several reasons. First, because a selected input signal and its complement are always selected by SA-SC to propagate through MUXes 310 and 320 to reach nodes A and B, the logic "0" of the selected signal pair will propagate through the NMOS pass gates in the multiplexer circuit without any voltage drop, thereby triggering its output inverter to drive the output signal high to VDDH and turning on the PMOS pull-up transistor in the complementary signal path to restore the logic "1" of the complemented signal to VDDH to trigger that output inverter to drive its output signal low to ground potential. In this manner, the low-voltage select signals SA-SC may be used to select one of the high-voltage input signals IN0-IN7 to be output from circuit 300 as a high-voltage complementary pair OUT and $\overline{OUT}$. Further, by restoring the voltage of a logic "1" signal at an input of output circuit 340 from VDDL−Vth to VDDH, the PMOS pull-up transistor (not shown for simplicity) in the corresponding CMOS inverter 343/344 is completely turned off, thereby eliminating short circuits between VDDH and ground potential through the corresponding inverter 343/344.

For other embodiments, a first gain stage similar to output circuit 340 may be added between the second and third hierarchical levels of MUX 310, and a second gain stage similar to output circuit 340 may be added between the second and third hierarchical levels of MUX 320, thereby increasing the strength of the signals provided to transistors MC0-MC1 and increasing the strength of the complementary signals provided to transistors MC2-MC3.

Figure 4:
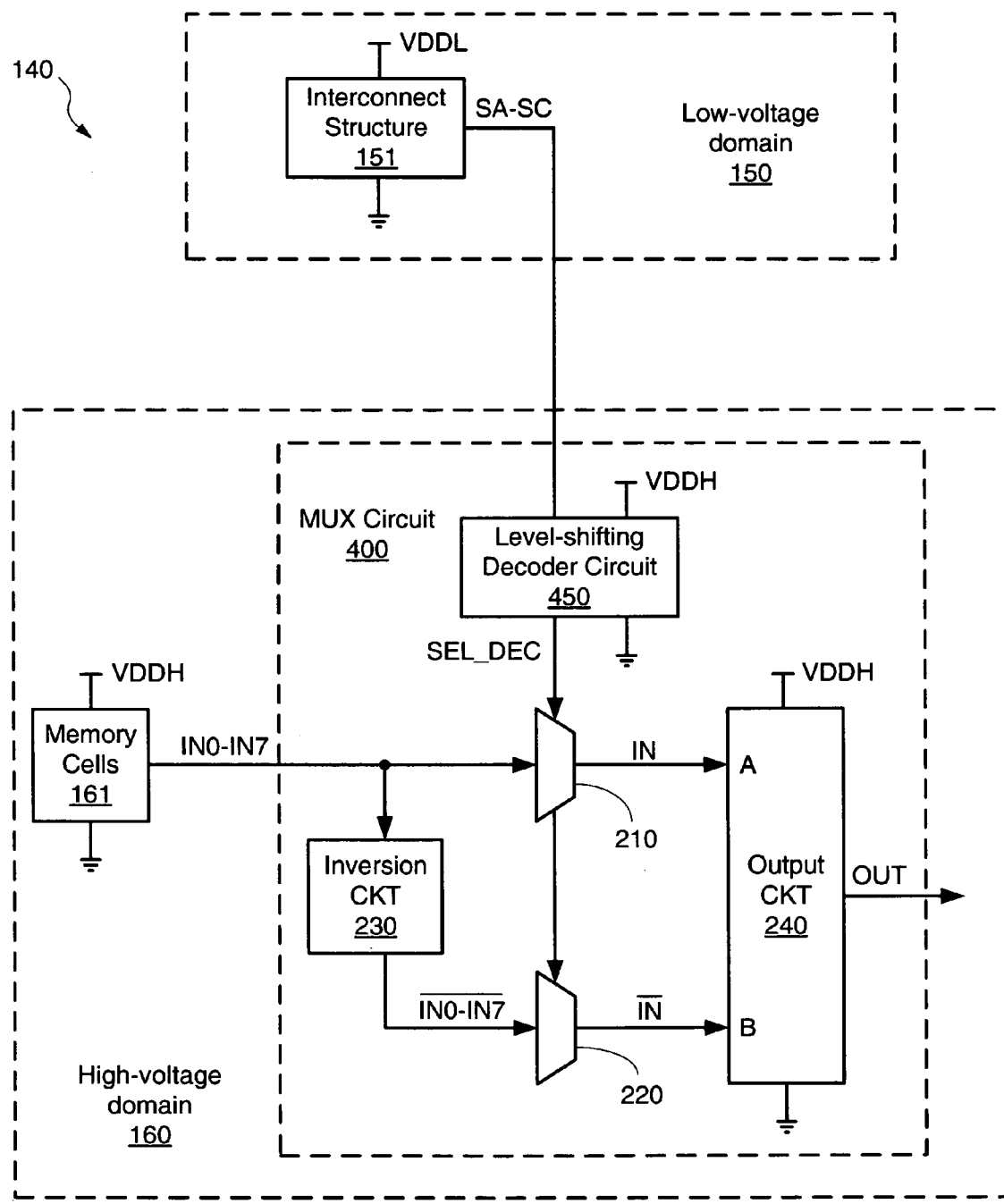
FIG. 4 is a simplified functional block diagram of an IC device including a level-shifting multiplexer circuit in accordance with second embodiments of the present invention.

FIG. 4 shows IC device 140 including a pseudo-differential multiplexer circuit 400 in accordance with second embodiments of the present invention. MUX circuit 400 includes all the elements of circuit 200 of FIG. 2, with the addition of a level-shifting decoder circuit 450. Decoder circuit 450, which has power terminals coupled to VDDH and ground potential, includes an input to receive low-voltage select signals SA-SC and includes an output to generate high-voltage decoded select signals SEL_DEC. In this manner, the decoded signals SEL_DEC are high-voltage signals that have logic "1" values of approximately VDDH. Therefore, because the gates of the NMOS pass transistors within MUXes 210 and 220 are driven by logic "1" values of VDDH, rather than VDDL, the propagation delay of logic high signals IN0-IN7 through MUX 210 and the propagation delay of logic high signals $\overline{IN0}$-$\overline{IN7}$ through MUX 220 may be reduced, for example, as compared to the exemplary embodiments of MUX circuit 200 of FIG. 2. Further, driving the NMOS pass gates within MUXes 210 and 220 with logic "1" values of VDDH (e.g., instead of VDDL) increases the resultant voltage of logic "1" states of IN and $\overline{IN}$, which in turn may reduce the charging times of nodes A and B. In addition, decoding the encoded select signals SA-SC to generate SEL_DEC may reduce the number of transistors needed to implement MUXes 210 and 220 of MUX circuit 400, for example, as compared to MUX circuit 200 of FIG. 2, thereby conserving valuable circuit area and reducing the number of gate delays in the MUX circuit.

Figure 5:
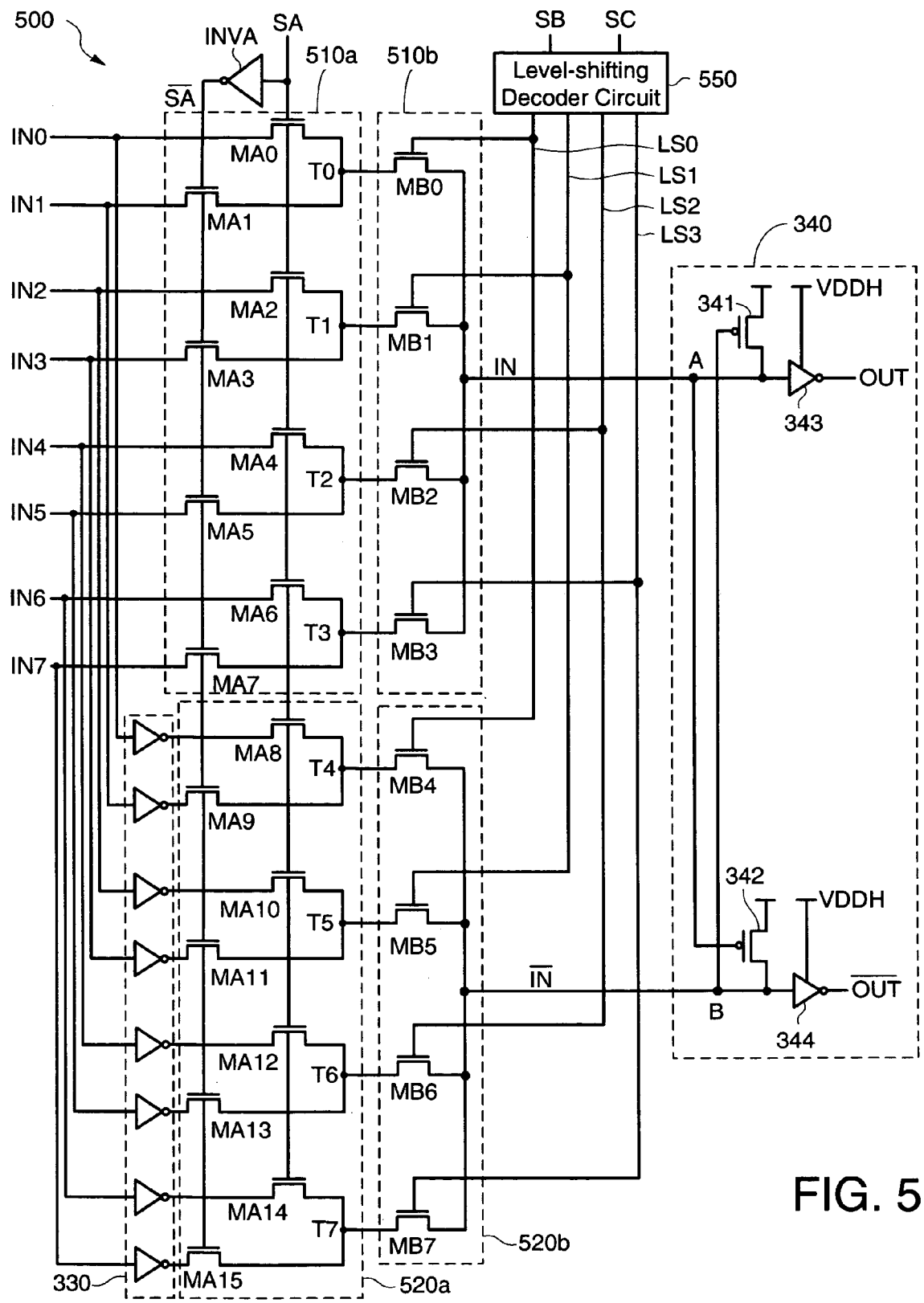
FIG. 5 is a circuit diagram of one embodiment of the level-shifting multiplexer circuit of FIG. 4.

FIG. 5 shows a MUX circuit 500 that is one embodiment of MUX circuit 400 of FIG. 4. Circuit 500 is shown to include a first MUX 510 having a first portion 510a and a second portion 510b, a second MUX 520 having a first portion 520a and a second portion 520b, input signal inversion circuit 330, output circuit 340, and a level-shifting decoder circuit 550. As mentioned above with respect to FIG. 2, select signals SA-SC are received from low-voltage domain 150 and thus have logic "1" values equal to VDDL. Although not shown for simplicity, inverter INVA has power terminals coupled to VDDL and ground potential, and therefore $\overline{SA}$ has a logic "1" value equal to VDDL. Thus, although depicted in FIG. 5 as part of MUX circuit 500, for actual embodiments, INVA may be provided within the low-voltage domain 150 of the IC device.

Level-shifting decoder circuit 550 includes inputs to receive encoded select signals SB-SC, and includes outputs to generate level-shifted decoded select signals LS0-LS3. Together, LS0-LS3, SA, and $\overline{SA}$ form the decoded signals SEL_EN. Thus, although not shown in FIG. 5 for simplicity, decoder circuit 550 has power terminals coupled to VDDH and ground potential, and therefore the logic "1" values of decoded select signals LS0-LS3 output from decoder circuit 550 are equal to approximately VDDH. In this manner, decoder circuit 550 level-shifts low-voltage signals SB-SC received from the low-voltage domain 150 to generate high-voltage decoded select signals LS0-LS3. For other embodiments, level-shifting decoder circuit 550 may be modified to receive low-voltage select signal SA and configured to generate a high-voltage select signal SA and a high-voltage complementary signal $\overline{SA}$, for example, so that signals SA, $\overline{SA}$, and LS0-LS3 all have logic "1" values of approximately VDDH.

MUXes 510a-510b, which together form another embodiment of MUX 210 of FIGS. 2 and 4, selectively provide one of input signals IN0-IN7 as IN to node A in response to select signals SA-$\overline{SA}$ and decoded select signals LS0-LS3. MUX 510a is similar in architecture and operation to the first hierarchical level of MUX 310 of FIG. 3, for example, in that NMOS transistor pairs MA0-MA1, MA2-MA3, MA4-MA5, and MA6-MA7 receive input signal pairs IN0-IN1, IN2-IN3, IN4-IN5, and IN6-IN7, respectively, and are coupled to internal MUX terminals T0-T3, respectively. Further, within each transistor pair in the first hierarchical level 510a, the gate of one transistor is controlled by SA and the gate of the other transistor is controlled by $\overline{SA}$. Thus, for the exemplary embodiment of FIG. 5, transistors MA0, MA2, MA4, and MA6 are controlled by SA, and transistors MA1, MA3, MA5, and MA7 are controlled by $\overline{SA}$. MUX 510b includes a single hierarchical level of four NMOS transistors MB0-MB3, each of which is coupled between a corresponding pair of transistors in first-level MUX 510a and node A and has a gate to receive a corresponding one of level-shifted decoded select signals LS0-LS3. Thus, for the exemplary embodiment of FIG. 5, pass transistor MB0 is coupled between internal terminal T0 and node A, and has a gate to receive LS0; pass transistor MB1 is coupled between internal terminal T1 and node A, and has a gate to receive LS1; pass transistor MB2 is coupled between internal terminal T2 and node A, and has a gate to receive LS2; and pass transistor MB3 is coupled between internal terminal T3 and node A, and has a gate to receive LS3.

MUXes 520a-520b, which together form another embodiment of MUX 220 of FIGS. 2 and 4, selectively provide one of complemented input signals $\overline{IN0}$-$\overline{IN7}$ as $\overline{IN}$ to node B in response to select signals SA-$\overline{SA}$ and decoded select signals LS0-LS3. MUX 520a is similar in architecture and operation to the first hierarchical level of MUX 320 of FIG. 3, for example, in that NMOS transistor pairs MA8-MA9, MA10-MA11, MA12-MA13, and MA14-MA15 receive input signal pairs $\overline{IN0}$-$\overline{IN1}$, $\overline{IN2}$-$\overline{IN3}$, $\overline{IN4}$-$\overline{IN5}$, and $\overline{IN6}$-$\overline{IN7}$, respectively, and are coupled to internal MUX terminals T4-T7, respectively. Further, within each transistor pair in the first hierarchical level 520a, the gate of one transistor is controlled by SA and the gate of the other transistor is controlled by $\overline{SA}$. Thus, for the exemplary embodiment of FIG. 5, transistors MA8, MA10, MA12, and MA14 are controlled by SA, and transistors MA9, MA11, MA13, and MA15 are controlled by $\overline{SA}$. MUX 520b includes a single hierarchical level of four NMOS transistors MB4-MB7, each of which is coupled between a corresponding pair of transistors in first-level MUX 520a and node B and has a gate to receive a corresponding one of level-shifted decoded select signals LS0-LS3. Thus, for the exemplary embodiment of FIG. 5, pass transistor MB4 is coupled between internal terminal T4 and node B, and has a gate to receive LS0; pass transistor MB5 is coupled between internal terminal T5 and node B, and has a gate to receive LS1; pass transistor MB6 is coupled between internal terminal T6 and node B, and has a gate to receive LS2; and pass transistor MB7 is coupled between internal terminal T7 and node B, and has a gate to receive LS3.

As mentioned above, level-shifting decoder circuit 550 receives low-voltage encoded select signals SB-SC (e.g., having logic "1" values of VDDL) and in response thereto generates four high-voltage decoded select signals LS0-LS3 (e.g., having logic "1" values of VDDH) that select one of the four possible intermediate signals in each of second-level MUX circuits 510b and 520b. Decoder circuit 550 may employ any suitable combinational logic circuitry to generate LS0-LS3 in response to SB-SC. For some embodiments, the logical relationship between SB-SC and LS0-LS3 is as shown below in Table 1, although other relationships between SB-SC and LS0-LS3 may be employed for other embodiments.

TABLE 1

| SB | SC | LS0 | LS1 | LS2 | LS3 |
|----|----|-----|-----|-----|-----|
| 0  | 0  | 1   | 0   | 0   | 0   |
| 0  | 1  | 0   | 1   | 0   | 0   |
| 1  | 0  | 0   | 0   | 1   | 0   |
| 1  | 1  | 0   | 0   | 0   | 1   |

For example, referring again to FIG. 5, if SA is driven to "1," SB is driven to "1," and SC is driven to "0," input signals IN4 and $\overline{IN4}$ are provided as IN and $\overline{IN}$ to nodes A and B, respectively. More specifically, the logic "1" state of SA turns on pass transistors MA0, MA2, MA4, MA6, MA8, MA10, MA12, and MA14. Driving SB to logic "1" and driving SC to logic "0" causes decoder circuit 550 to drive LS0, LS1, and LS3 to logic "0" and to drive LS2 to logic "1." The logic high state of LS2 turns on NMOS pass transistors MB2 and MB6, which in turn propagate IN4 as IN to node A and propagate $\overline{IN4}$ as $\overline{IN}$ to node B. Assuming that IN4 is logic high and that $\overline{IN4}$ is logic low, the voltage at node A should be equal to VDDH−Vth, and the voltage at node B should be approximately 0 volts. The logic low voltage at node B causes inverter 344 to drive $\overline{OUT}$ high to VDDH, and also turns on pull-up transistor 341, which pulls node A higher to VDDH (e.g., from VDDH−Vth). The high voltage at node A causes inverter 343 to drive OUT low to ground potential, and also turns off pull-up transistor 342 to isolate node B from VDDH. For other embodiments, pull-up transistors 341 and 343 may be eliminated from output circuit 340 of FIG. 5.

As mentioned above, to select one of input signals IN0-IN7, decoder circuit 550 asserts only one of LS0-LS3 to logic "1" and de-asserts the remaining decoded select signals to logic "0," thereby enabling only one of the four paths in each of MUX circuits 510b and 520b. The remaining three paths in both MUX circuits 510b and 520b are cut-off by applying a zero voltage to the corresponding NMOS pass gates, thereby advantageously preventing leakage current in circuit 500. Further, by encoding select signals SB-SC to generate decoded select signals LS0-LS3 that control the NMOS transistors MB0 and MB4, MB1 and MB5, MB2 and MB6, and MB3 and MB7, respectively, the circuit 500 of FIG. 5 may operate using only two hierarchical levels of pass gates, for example, as compared to MUX circuit 300 of FIG. 3, which requires three hierarchical levels of pass gates, thereby reducing the number of gate delays through MUX circuit 500. Further, because the selected paths in MUXes 510b and 520b are driven by a logic high value of VDDH, voltage drops and propagation delays through MUXes 510b and 520b are minimized.

Figure 6:
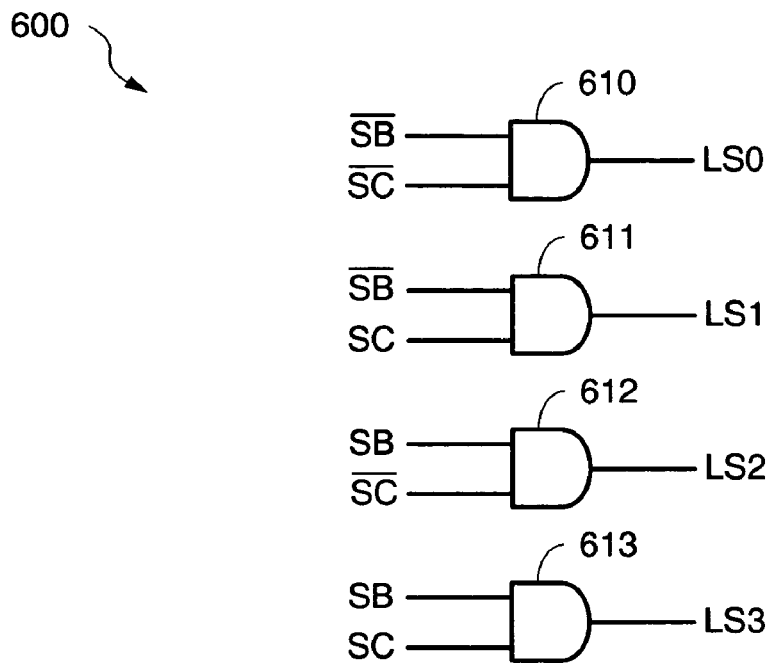
FIG. 6 is a block diagram of one embodiment of the level-shifting decoder circuit of FIG. 5.

FIG. 6 is a functional block diagram of an exemplary embodiment 600 of level-shifting decoder circuit 500 that implements the logic functions summarized in Table 1 above. Circuit 600 includes four logical AND gates 610-613, where AND gate 610 includes inputs to receive $\overline{SB}$ and $\overline{SC}$ and includes an output to generate LS0, AND gate 611 includes inputs to receive $\overline{SB}$ and SC and includes an output to generate LS1, AND gate 612 includes inputs to receive SB and $\overline{SC}$ and includes an output to generate LS2, and AND gate 613 includes inputs to receive SB and SC and includes an output to generate LS3. Thus, AND gate 610 asserts LS0 to logic "1" only if both $\overline{SB}$ and $\overline{SC}$ are logic "1", AND gate 611 asserts LS1 to logic "1" only if both $\overline{SB}$ and SC are logic "1," AND gate 612 asserts LS2 to logic "1" only if both SB and $\overline{SC}$ are logic "1", and AND gate 613 asserts LS3 to logic "1" only if both SB and SC are logic "1."

Of course, for other embodiments, the AND gates 610-613 of circuit 600 may receive other SB/SC signal pairs to implement logic functions of LS0-LS3 from SB-SC that are different from the exemplary logic function depicted in Table 1, as will be apparent to one skilled in the art after reading this disclosure. Further, for other embodiments, logic gates other than AND gates may be used to generate LS0-LS3 in response to SB-SC.

Figure 7:
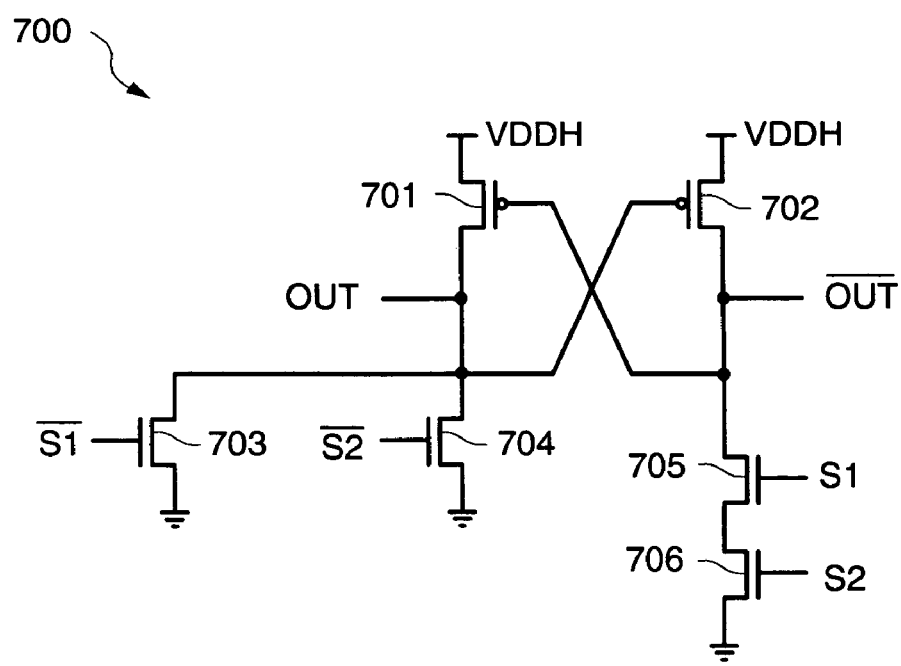
FIG. 7 is a circuit diagram of one embodiment of the AND gate of FIG. 6.

FIG. 7 shows an exemplary differential level-shifting AND gate 700 that may be used to implement AND gates 610-613 of FIG. 6. AND gate 700, which is configured to generate an AND function of its input signals while performing a level-shifting function, includes cross-coupled PMOS transistors 701-702 and NMOS pull-down transistors 703-706. PMOS transistor 701 is connected between VDDH and OUT and has a gate coupled to $\overline{OUT}$, and PMOS transistor 702 is connected between VDDH and $\overline{OUT}$, and has a gate coupled to OUT. NMOS transistor 703 is coupled between OUT and ground potential, and has a gate to receive the complement of a first select signal ($\overline{S1}$). NMOS transistor 704 is coupled between OUT and ground potential, and has a gate to receive the complement of a second select signal ($\overline{S2}$). NMOS transistors 705-706 are coupled in series between $\overline{OUT}$ and ground potential, with the gate of transistor 705 receiving the first select signal (S1) and the gate of transistor 706 receiving the second select signal (S2). The differential input signals S1-$\overline{S1}$ and S2-$\overline{S2}$ are low-voltage signals having logic "1" values equal to VDDL, and the differential output signal OUT-$\overline{OUT}$ is a high-voltage signal having a logic "1" value equal to VDDH.

Circuit 700 is advantageous because it is capable of level-shifting low-voltage select signals S1-S2 to generate high-voltage differential output signals OUT and $\overline{OUT}$ while preventing short circuits between VDDH and ground potential, regardless of the voltage of VDDL. For one example, if S1 is logic "1" and S2 is logic "0," NMOS pull-down transistor 706 completely turns off, thereby preventing a current path from VDDH to ground potential through transistors 705-706. The resultant logic "1" value of $\overline{S2}$ turns on NMOS transistor 704, which pulls OUT low towards ground potential. The resultant logic low state of OUT turns on PMOS transistor 702, which pulls $\overline{OUT}$ high towards VDDH. The high voltage at $\overline{OUT}$ completely turns off PMOS transistor 701, thereby isolating OUT from VDDH and preventing a short circuit between VDDH and ground potential through transistor 701. For another example, if S1 and S2 are both logic "1," NMOS pull-down transistors 705-706 turn on, thereby pulling $\overline{OUT}$ low to ground potential. The resultant logic low state of $\overline{OUT}$ turns on PMOS transistor 701, which pulls OUT high towards VDDH. The resultant logic high state of OUT completely turns off PMOS transistor 702, thereby isolating $\overline{OUT}$ from VDDH and preventing a short circuit path between VDDH and ground potential through transistor 702. The resultant logic "0" values of $\overline{S1}$ and $\overline{S2}$ turn off NMOS transistors 703 and 704, respectively, thereby preventing a short circuit between VDDH and ground potential through transistor 701.

As mentioned above, circuit 700 may be used to implement any of AND gates 610-613 of FIG. 6. For one example, circuit 700 may be used to implement the first AND gate 610 of FIG. 6 by coupling SB to the gate of transistor 703, coupling SC to the gate of transistor 704, coupling $\overline{SB}$ to the gate of transistor 705, and coupling $\overline{SC}$ to the gate of transistor 706, wherein OUT provides LS0. Thus, if $\overline{SB}$ and $\overline{SC}$ are logic "0," the resultant logic "1" states of SB and SC turn on NMOS pull-down transistors 703-704 and pull OUT low to ground potential, thereby driving LS0 to logic "0." However, if $\overline{SB}$ and $\overline{SC}$ are logic "1," NMOS pull-down transistors 705-706 turn on and pull $\overline{OUT}$ low to ground potential, which turns on pull-up transistor 701 and pulls OUT high to VDDH, thereby driving LS0 to logic "1," as summarized in Table 1.

Figure 8:
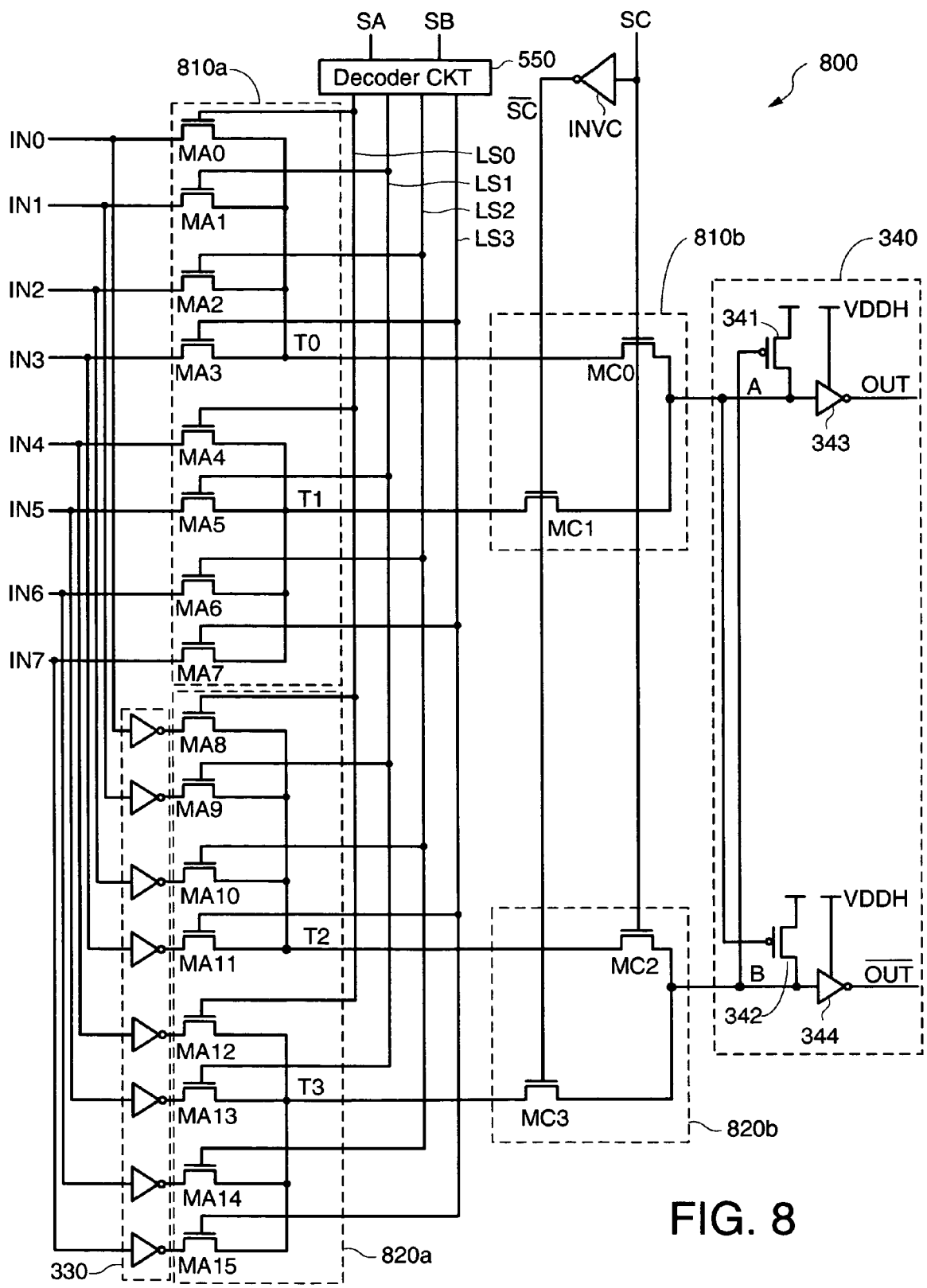
FIG. 8 is a circuit diagram of another embodiment of the level-shifting multiplexer circuit of FIG. 4.

FIG. 8 shows a MUX circuit 800 that is another embodiment of MUX circuit 400 of FIG. 4. Circuit 800 is shown to include a first MUX 810 having a first portion 810a and a second portion 810b, a second MUX 820 having a first portion 820a and a second portion 820b, inversion circuit 330, output circuit 340, and level-shifting decoder circuit 550. As mentioned above with respect to FIG. 2, select signals SA-SC are received from a low-voltage domain, and thus SA-SC have logic "1" values equal to VDDL. Although not shown for simplicity, inverter INVC has power terminals coupled to VDDL and ground potential, and therefore $\overline{SC}$ has a logic "1" value equal to VDDL. Thus, although depicted in FIG. 8 as part of MUX circuit 800, for actual embodiments, INVC may be provided within the low-voltage domain 150 of the IC device.

Level-shifting decoder circuit 550 includes inputs to receive SA-SB, and includes outputs to generate level-shifted decoded select signals LS0-LS3, which together form SEL_DEC. Thus, although not shown in FIG. 8 for simplicity, decoder circuit 550 has power terminals coupled to VDDH and ground potential, and therefore the logic "1" values of select signals LS0-LS3 output from decoder circuit 550 are equal to approximately VDDH. In this manner, decoder circuit 550 level-shifts low-voltage signals SA-SB received from the low-voltage domain 150 to generate high-voltage decoded select signals LS0-LS3. For other embodiments, level-shifting decoder circuit 550 may be modified to receive low-voltage select signal SC and configured to generate a high-voltage select signal SC and a high-voltage complementary signal $\overline{SC}$, for example, so that signals SC, $\overline{SC}$, and LS0-LS3 all have logic "1" values of approximately VDDH.

MUXes 810a-810b, which together form another embodiment of MUX 210 of FIGS. 2 and 4, selectively provide one of input signals IN0-IN7 to node A in response to select signals SC, $\overline{SC}$, and LS0-LS3. MUX 810a includes a single hierarchical level of eight NMOS transistors MA0-MA7 that receive input signals IN0-IN7, respectively, where the gates of pass transistors MA0 and MA4 receive LS0, the gates of pass transistors MA1 and MA5 receive LS1, the gates of pass transistors MA2 and MA6 receive LS2, and the gates of pass transistors MA3 and MA7 receive LS3. MUX 810b is similar in architecture and operation to the third hierarchical level of MUX 310 of FIG. 3 in that for the NMOS transistor pair MC0-MC1, transistor MC0 receives one of IN0-IN3 from internal terminal T0 as an intermediate signal and is controlled by SC, and transistor MC1 receives one of IN4-IN7 from internal terminal T1 as an intermediate signal and is controlled by $\overline{SC}$.

MUXes 820a-820b, which together form another embodiment of MUX 220 of FIGS. 2 and 4, selectively provide one of input signals $\overline{IN0}$-$\overline{IN7}$ to node B in response to select signals SC, $\overline{SC}$, and LS0-LS3. MUX 820a includes a single hierarchical level of eight NMOS transistors MA8-MA15 that receive complemented input signals $\overline{IN0}$-$\overline{IN7}$, respectively, where the gates of pass transistors MA8 and MA12 receive LS0, the gates of pass transistors MA9 and MA13 receive LS1, the gates of pass transistors MA10 and MA14 receive LS2, and the gates of pass transistors MA11 and MA15 receive LS3. MUX 820b is similar in architecture and operation to the third hierarchical level of MUX 320 of FIG. 3 in that for the NMOS transistor pair, transistor MC2 receives one of $\overline{IN0}$-$\overline{IN3}$ as an intermediate signal from internal terminal T2 and is controlled by SC, and transistor MC3 receives one of $\overline{IN4}$-$\overline{IN7}$ as an intermediate signal from internal terminal T3 and is controlled by $\overline{SC}$.

As mentioned above, level-shifting decoder circuit 550 receives low-voltage encoded select signals SA-SB (e.g., having logic "1" values of VDDL) and in response thereto generates four high-voltage decoded select signals LS0-LS3 (e.g., having logic "1" values of VDDH) that select two of the eight possible signal paths in each of first-level MUX circuits 810a and 820a. In this manner, voltage drops and propagation delays through MUXes 810a and 820b are minimized. The encoded select signal pair SC and $\overline{SC}$ select one of the intermediate signals from each MUX 810a and 810b for output to output circuit 340. Further, by encoding select signals SA-SB to generate decoded select signals LS0-LS3 that control the NMOS transistors MA0-MA15, the circuit 800 of FIG. 8 may operate using only two hierarchical levels of pass gates, thereby reducing the number of gate delays through the multiplexer circuit, for example, as compared to the MUX circuit 300 of FIG. 3, which requires three hierarchical levels of pass gates, thereby reducing the number of gate delays through MUX circuit 800.

The embodiment of FIG. 8 is advantageous over the embodiment of FIG. 5 for applications in which select signal SC involves a critical timing path.

Decoder circuit 550 may employ any suitable combinational logic circuitry to generate LS0-LS3 in response to SA-SB. For some embodiments, the logical relationship between SA-SB and LS0-LS3 is as shown below in Table 2, although other relationships between SA-SB and LS0-LS3 may be employed for other embodiments.

TABLE 2

| SA | SB | LS0 | LS1 | LS2 | LS3 |
|----|----|-----|-----|-----|-----|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

The logic states of LS0-LS3 may be generated in response to SA-SB using well-known combinational logic circuitry. For some embodiments, the decoder circuit 600 of FIG. 6 and level-shifting AND gate 700 of FIG. 7 may be used to generate LS0-LS3 in response to SA-SB. For other embodiments, other circuitry may be used.

Figure 9:
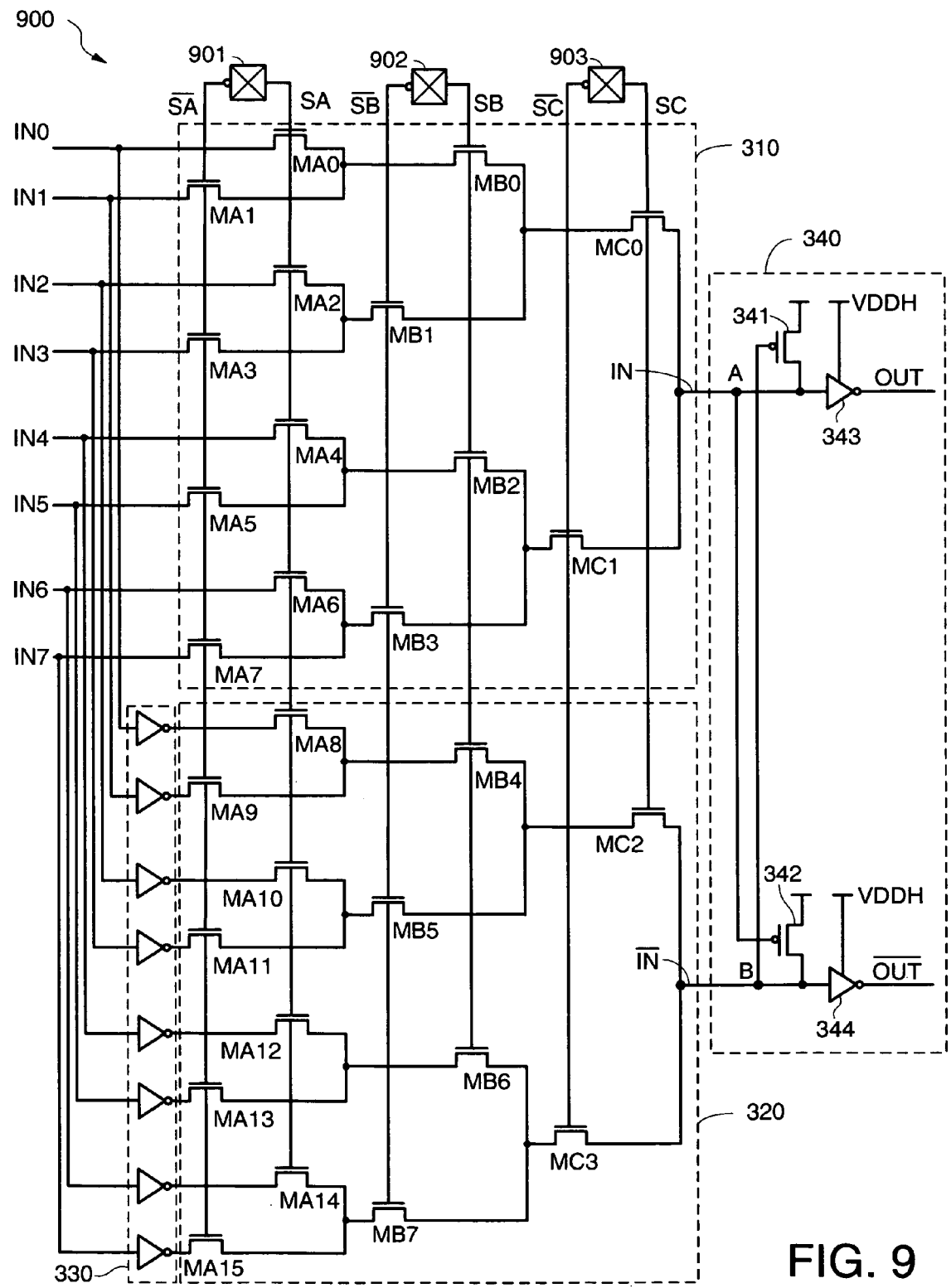
FIG. 9 is a circuit diagram of one embodiment of the level-shifting multiplexer circuit of FIG. 2 that may be used to implement signal routing functions.

As described above, embodiments of the present invention may be used to implement LUTs, for example, in the CLBs of an FPGA device. Embodiments of the present invention may also be used to implement signal routing functions, for example, in the switch fabric of FPGA devices. For example, FIG. 9 shows a MUX circuit 900 that may be used to selectively route input signals IN0-IN7 as OUT and $\overline{OUT}$ in response to SA-SC. MUX circuit 900 is similar in architecture and operation to MUX circuit 300 of FIG. 3, except that inverters INVA-INVC of FIG. 3 are replaced by memory cells 901-903, respectively, in FIG. 9. Memory cells 901-903, which may be any suitable memory cells such as, for example, DRAM or SRAM cells, provide select signals SA-SC and their complements $\overline{SA\text{-}SC}$ to MUXes 310 and 320. For some embodiments, memory cells 901-903 are configuration memory cells that control signal routing functions in an FPGA.

Memory cells 901-903 may be powered by any suitable supply voltage. For an exemplary embodiment, memory cells 901-903 are powered by VDDH, and input signals IN0-IN7 are provided by interconnect structure 151 (see also FIG. 2), which is powered by VDDL.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention. For example, although the exemplary embodiments are described above with respect to an 8:1 MUX structure responsive to 3 select signals, it will be apparent to those skilled in the art after reading this disclosure that the teachings of the present invention may be readily applied to MUX architectures having more or fewer than 8 inputs and more or fewer than 3 select terminals.

What is claimed is:

1. An integrated circuit (IC) device, comprising:
   a low-voltage domain having a power terminal coupled to a low supply voltage and including circuitry to generate a number of low-voltage select signals; and
   a high-voltage domain having a power terminal coupled to a high supply voltage, the high supply voltage greater than the low supply voltage, and including circuitry to provide a plurality of input signals and including a multiplexing circuit, the multiplexing circuit comprising:
      a level-shifting decoder circuit having inputs to receive at least two of the low-voltage select signals and configured to generate a number of high-voltage decoded select signals;
      a first multiplexer having input terminals to receive the plurality of input signals, having select terminals responsive to a combination of the low-voltage select signals and the high-voltage decoded select signals, and having an output;
      an inversion circuit having input terminals to receive the plurality of input signals and configured to generate a plurality of complemented input signals;
      a second multiplexer having input terminals to receive the plurality of complemented input signals, having select terminals responsive to the combination of the low-voltage select signals and the high-voltage decoded select signals, and having an output; and
      an output circuit having inputs coupled to the outputs of the first and second multiplexers, and having first and second outputs to generate a differential output signal.

2. The IC device of claim 1, wherein the multiplexing circuit includes three control terminals to receive three low-voltage select signals,
   wherein the first multiplexer includes eight input terminals to receive eight input signals,
   wherein the second multiplexer includes eight input terminals to receive eight complemented input signals,
   wherein the level-shifting decoder circuit generates four high-voltage decoded select signals by decoding and level-shifting a first low-voltage select signal and a second low-voltage select signal of the three low-voltage select signals, and
   wherein each of the first and second multiplexers include select terminals to receive the four high-voltage decoded select signals and to receive a third low-voltage select signal of the low-voltage select signals.

3. The IC device of claim 2, wherein the first multiplexer consists of two hierarchical levels of pass transistors that selectively propagate one of the eight input signals to the output of the first multiplexer in response to the select signals such that the selected input signal passes through only two of the pass transistors in the first multiplexer.

4. The IC device of claim 2, wherein the level-shifting decoder circuit comprises:
   a first AND gate having inputs to receive the first and second low-voltage select signals, and having an output to generate a first high-voltage decoded select signal of the four high-voltage decoded select signals;
   a second AND gate having inputs to receive the first low-voltage select signal and a complement of the second low-voltage select signal, and having an output to generate a second high-voltage decoded select signal of the four high-voltage decoded select signals;

a third AND gate having inputs to receive a complement of the first low-voltage select signal and the second low-voltage select signal, and having an output to generate a third high-voltage decoded select signal of the four high-voltage decoded select signals; and a fourth AND gate having inputs to receive the complement of the first low-voltage select signal and the complement of the second low-voltage select signal, and having an output to generate a fourth high-voltage decoded select signal of the four high-voltage decoded select signals.

5. The IC device of claim 4, wherein the first AND gate comprises:

first and second outputs for generating the first high-voltage decoded select signal and its complement;

a first pull-up transistor coupled between the high supply voltage and a first output of the AND gate, and having a gate coupled to a second output of the AND gate;

a second pull-up transistor coupled between the high supply voltage and the second output of the AND gate, and having a gate coupled to the first output of the AND gate;

a first pull-down transistor coupled between the first output terminal of the AND gate and ground potential and having a gate to receive the complement of the first low-voltage select signal;

a second pull-down transistor coupled between the first output terminal of the AND gate and ground potential and having a gate to receive the complement of the second low-voltage select signal; and third and fourth pull-down transistors connected in series between the second output terminal of the AND gate and ground potential, wherein the third pull-down transistor has a gate to receive the first low-voltage select signal, and the fourth pull-down transistor has a gate to receive the second low-voltage select signal.

6. The IC device of claim 1, wherein the output circuit comprises:

a first inverter coupled between the output of the first multiplexer and the first output of the output circuit;

a second inverter coupled between the output of the second multiplexer and the second output of the output circuit;

a first pull-up transistor coupled between the high supply voltage and the output of the first multiplexer, and having a gate coupled to the output of the second multiplexer; and a second pull-up transistor coupled between the high supply voltage and the output of the second multiplexer, and having a gate coupled to the output of the first multiplexer.

7. The IC device of claim 1, wherein the first multiplexer consists of:

a first hierarchical level including a number of first transistor pairs each for receiving a corresponding pair of the input signals, wherein the first transistor pairs are responsive to a first low-voltage select signal of the low-voltage select signals; and a second hierarchical level including of a number of second transistors each coupled between a corresponding pair of the first transistors and the output of the first multiplexer, wherein each of the second transistors has a gate responsive to a corresponding one of the high-voltage decoded select signals.

8. The IC device of claim 7, wherein the level-shifting decoder circuit generates the high-voltage decoded select signals in response to the other low-voltage select signals.

9. The IC device of claim 7, wherein the second multiplexer comprises:

a first hierarchical level including a number of third transistor pairs each for receiving a corresponding pair of the complemented input signals, wherein the third transistor pairs are responsive to the first low-voltage select signal of the low-voltage select signals; and a second hierarchical level including a number of fourth transistors each coupled between a corresponding pair of the third transistors and the output of the second multiplexer, wherein each of the fourth transistors has a gate responsive to a corresponding one of the high-voltage decoded select signals.

10. The IC device of claim 1, wherein the first multiplexer consists of:

a first hierarchical level, including:

a number of first transistors having gates responsive to the high-voltage select signals, wherein each first transistor is coupled between a corresponding one of the input signals and a first internal terminal; and a number of second transistors having gates responsive to the high-voltage select signals, wherein each second transistor is coupled between a corresponding one of the input signals and a second internal terminal; and a second hierarchical level including:

a pair of third transistors for selectively coupling one of the first internal terminal and the second internal terminal to the output of the first multiplexer in response to a first low-voltage select signal of the low-voltage select signals.

11. The IC device of claim 10, wherein the level-shifting decoder circuit generates the high-voltage decoded select signals in response to the other low-voltage select signals.

12. The IC device of claim 10, wherein the second multiplexer consists of:

a first hierarchical level, including:

a number of fourth transistors having gates responsive to the high voltage decoded select signals, wherein each fourth transistor is coupled between a corresponding one of the complemented input signals and a third internal terminal; and a number of fifth transistors having gates responsive to the high voltage decoded select signals, wherein each fifth transistor is coupled between a corresponding one of the complemented input signals and a fourth internal terminal; and a second hierarchical level including:

a pair of sixth transistors for selectively coupling one of the third internal terminal and the fourth internal terminal to the output of the second multiplexer in response to the first low-voltage select signal of the low-voltage select signals.

13. The IC device of claim 1, wherein the IC device comprises a field programmable gate array (FPGA), the circuitry provided within the low-voltage domain comprises an interconnect structure, and the circuitry provided within the high-voltage domain comprises a plurality of configuration memory cells for storing the input signals, wherein the configuration memory cells and the multiplexer circuit form a look-up table.

14. A look-up table for selectively outputting one of eight input signals in response to three encoded select signals as a differential output signal between first and second output terminals, the look-up table comprising:

a level-shifting decoder circuit for generating four decoded select signals in response to a logical combination of a first encoded select signal and a second encoded select signal of the encoded select signals;

a first multiplexer for selectively passing four of the eight input signals as first intermediate signals in response to a third encoded select signal of the encoded select signals;

a second multiplexer for selectively passing one of the first intermediate signals to the first output terminal in response to the four decoded select signals;

means for logically inverting the eight input signals to generate eight complemented input signals;

a third multiplexer for selectively passing four of the eight complemented input signals as second intermediate signals in response to the third encoded select signal; and a fourth multiplexer for selectively passing one of the second intermediate signals to the second output terminal in response to the four decoded select signals.

15. The look-up table of claim 14, further including an output circuit, comprising:

a first inverter coupled between an output of the second multiplexer and the first output terminal of the look-up table;

a second inverter coupled between an output of the fourth multiplexer and the second output terminal of the look-up table;

a first pull-up transistor coupled between a supply voltage and the output of the second multiplexer, and having a gate coupled to the output of the fourth multiplexer; and a second pull-up transistor coupled between the supply voltage and the output of the fourth multiplexer, and having a gate coupled to the output of the second multiplexer.

16. The look-up table of claim 14, wherein each of the first and third multiplexers consists of four transistor pairs, and each of the second and fourth multiplexers consists of four transistors.

17. A look-up table for selectively outputting one of eight input signals in response to three encoded select signals as a differential output signal between first and second output terminals, the look-up table comprising:

a level-shifting decoder circuit for generating four decoded select signals in response to a logical combination of a first encoded select signal and a second encoded select signal of the encoded select signals;

a first multiplexer for selectively passing two of the eight input signals as first intermediate signals in response to the four decoded select signals;

a second multiplexer for selectively passing one of the first intermediate signals to the first output terminal in response to a third encoded select signal of the encoded select signals;

means for logically inverting the eight input signals to generate eight complemented input signals;

a third multiplexer for selectively passing two of the eight complemented input signals as second intermediate signals in response to the four decoded select signals; and a fourth multiplexer for selectively passing one of the second intermediate signals to the second output terminal in response to the third encoded select signal.

18. The look-up table of claim 17, further including an output circuit, comprising:

a first inverter coupled between an output of the second multiplexer and the first output terminal of the look-up table;

a second inverter coupled between an output of the fourth multiplexer and the second output terminal of the look-up table;

a first pull-up transistor coupled between a supply voltage and the output of the second multiplexer, and having a gate coupled to the output of the fourth multiplexer; and a second pull-up transistor coupled between the supply voltage and the output of the fourth multiplexer, and having a gate coupled to the output of the second multiplexer.

19. The look-up table of claim 17, wherein each of the first and third multiplexers consists of eight transistors, and each of the second and fourth multiplexers consists of one transistor pair.

* * * * *